United States Patent [19]
Recchia et al.

[11] Patent Number: 5,864,467
[45] Date of Patent: Jan. 26, 1999

[54] CASCADABLE MODEM APPARATUS

[75] Inventors: Giovanni Recchia; Thomas Georgopulos, both of Clearwater, Fla.

[73] Assignee: Paradyne Corporation, Largo, Fla.

[21] Appl. No.: 799,573

[22] Filed: Feb. 12, 1997

[51] Int. Cl.⁶ .......................................................... H05K 7/14
[52] U.S. Cl. ........................... 361/732; 361/726; 361/744; 361/730; 361/801; 361/802; 361/725; 174/52.1; 220/23.4; 220/23.6; 220/23.2; 439/292; 439/717
[58] Field of Search ..................................... 361/732, 726, 361/744, 730, 801, 802, 756, 724, 735, 725; 174/52.1; 312/42; 220/23.4, 23.6, 23.2; 439/292, 717

[56] References Cited

U.S. PATENT DOCUMENTS

| | | | |
|---|---|---|---|
| 5,067,040 | 11/1991 | Fallik | 361/687 |
| 5,251,106 | 10/1993 | Hui | 361/744 |
| 5,288,251 | 2/1994 | Sumida | 439/701 |
| 5,373,104 | 12/1994 | Brauer | 174/52.1 |
| 5,544,969 | 8/1996 | Ammon et al. | 403/322 |
| 5,706,965 | 1/1998 | Honma et al. | 220/4.02 |

*Primary Examiner*—Leo P. Picard
*Assistant Examiner*—David Foster
*Attorney, Agent, or Firm*—Thomas, Kayden, Horstemeyer & Risley, LLP

[57] ABSTRACT

A cascadable modem apparatus includes a modem housing having a top and a bottom. A plurality of angled feet are attached to the housing bottom in cantilever fashion to define a distal portion of each foot. The feet serve both to support the modem on an platform as well as to attach the modem to a similarly configured, adjacent modem assembly. In the preferred embodiment, a plurality of receiving slots are defined in the housing top and are correspondingly disposed to receive the distal portions of a plurality of angled feet from an adjacent modem housing. In this way, insertion of the distal portions of the feet snugly into the receiving slots of an adjacent modem effectively attaches the two adjacent modem assemblies. Preferably, a resilient locking tab is attached to the housing bottom in cantilever fashion to define a distal portion directed away from the housing bottom. As a result, the tab is responsive to force applied to the distal portion to flex inwardly toward the housing bottom. A raised portion on the housing top is configured to engage a locking tab from an adjacent modem housing, flex the tab inwardly as the two adjacent modem housings are interconnected, and captively engage the locking tab when the two modem housings are aligned, to effectively interlock the two adjacent modem housings.

24 Claims, 5 Drawing Sheets

CASCADABLE MODEM APPARATUS

FIELD OF THE INVENTION

The present invention generally relates to data communication equipment (DCE) such as modems and digital service units (DSUs), and more particularly to a modem apparatus that is configured to be readily and securely cascaded with other similar modem apparatus.

DISCUSSION OF THE RELATED ART

DCEs such as modems and DSUs are well known mechanisms for allowing computers to exchange data or otherwise communicate. For example, modems have long been used in the personal computing area to permit a computer to communicate digital data electronically across standard telephone lines. In other environments, such as computer networks, a plurality of modems may be utilized by a single computer. It is noted here, at the outset, that the present invention is broadly directed to DCEs. For simplicity and convenience, however, the specification hereinafter will often make reference to modems. It is noted that the teachings used in connection with the term modem, unless specified otherwise, are intended to more broadly construed as covering DCEs, including DSUs.

Indeed, in computer networks and other environments, multiple modems are often cascaded. For example, consider a simple local area network (LAN), having a plurality of client workstations and a server that is connected to a plurality of telephone lines, whereby the client workstations may communicate with remote computers over the telephone lines.

It will be appreciated that a separate modem will be needed for each telephone line of communication. Therefore, if there are three modems connected to three telephone lines, then up to three of the client workstations may communicate with remote computers at any given time. Frequently, in LAN configurations, such a server may be implemented by a personal computer. Since internal, motherboard expansion slots are limited, external modems are frequently utilized, when a plurality of modems are implemented.

In central-site data centers it is known to stack modems in a horizontal configuration. That is, modems are laid on edge for convenient horizontal cascading along a shelf, albeit that the modems are relationally disposed in a "stacked" configuration.

The foregoing presents merely one example of a use of multiple modems in a particular environment, but it will be appreciated by those skilled in the various modem and communication arts that other scenarios and environments implicate the use of multiple, cascaded modems. What is significant for purposes of the present invention is the manner in which the modems are mechanically interconnected.

When multiple modem are cascaded in such a manner, they are typically electrically interconnected through the use of cabling, and then often loosely stacked upon top of one another. Disturbing the cabling or bumping the modem stack disrupts the modems and corrupts the stack, which then must be realigned. When placed in an environment that includes a person working around the modem stack, this type of disruption occurs all to often. In the past, this problem has been addressed by wrapping tape around a stack of modems to hold them together. However, this is an undesirably crude approach, and one that does not lend itself to readily disassembling a modem stack.

SUMMARY OF THE INVENTION

Accordingly, a primary object of the present invention is to provide a mechanism for securely interlocking a plurality of DCE devices, such as modems and DSUs.

A more specific object of the present invention is to provide a mechanism for interlocking a plurality of DCE devices in a neatly stacked configuration.

Another object of the present invention is to provide a mechanism for interlocking a plurality of external modems, and yet include a device for disengaging the DCE devices, when desired.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the is appended claims.

To achieve the foregoing and other objects, the present invention is generally directed to a cascadable DCE apparatus. In accordance with one aspect of the invention, the apparatus includes a housing having a top and a bottom. A plurality of angled feet are attached to the housing bottom in cantilever fashion to define a distal portion of each foot. A plurality of receiving slots are defined in the housing top and are correspondingly disposed to receive the distal portions of a plurality of angled feet from an adjacent modem housing. In this way, insertion of the distal portions of the feet snugly into the receiving slots of an adjacent housing, effectively attaches the two adjacent assemblies. Preferably, a resilient locking tab is attached to the housing bottom in cantilever fashion to define a distal portion directed away from the housing bottom. As a result, the tab is responsive to force applied to the distal portion to flex inwardly toward the housing bottom. A raised portion on the housing top is configured to engage a locking tab from an adjacent housing, flex the tab inwardly as the two adjacent housings are interconnected, and captively engage the locking tab when the two housings are aligned, to effectively interlock the two adjacent housings.

In accordance with a broader aspect of the invention, a cascadable DCE apparatus is provided having means for releasably attaching to an adjacent DCE apparatus of like configuration. Preferably, housing feet are specifically configured to serve a dual role. In one role, the feet serve to support the apparatus on a desktop or other planar surface. In another role, the feet serve to releasably attach a first apparatus to an adjacent apparatus. One embodiment of the present invention provides a set of feet that are cantilevered from a bottom of a housing. Correspondingly located receiving slots are provided on the top of the housing to receive feet of an adjacently disposed housing. Further, locking means having a release mechanism are provided to retain the adjacent assemblies in fixed relation. The release mechanism may simple comprise a spring-loaded or otherwise resilient tab that serves to engage a cooperative surface, and requiring a positive release force to be applied, in order to release the mechanism and, therefore, separate the adjacent housings. In another embodiment, the attaching means are provided in the form of modem feet disposed along the sides of the modem housing and depending therefrom. The feet are resiliently configured so that inwardly directed ridges engage outwardly directed ribs disposed on the modem housing, when two apparatus are brought into adjacent disposition, to securely attach the adjacent apparatus.

DESCRIPTION OF THE DRAWINGS

The accompanying drawings incorporated in and forming a part of the specification, illustrate several aspects of the present invention, and together with the description serve to explain the principles of the invention. In the drawings.

Figure 1A:
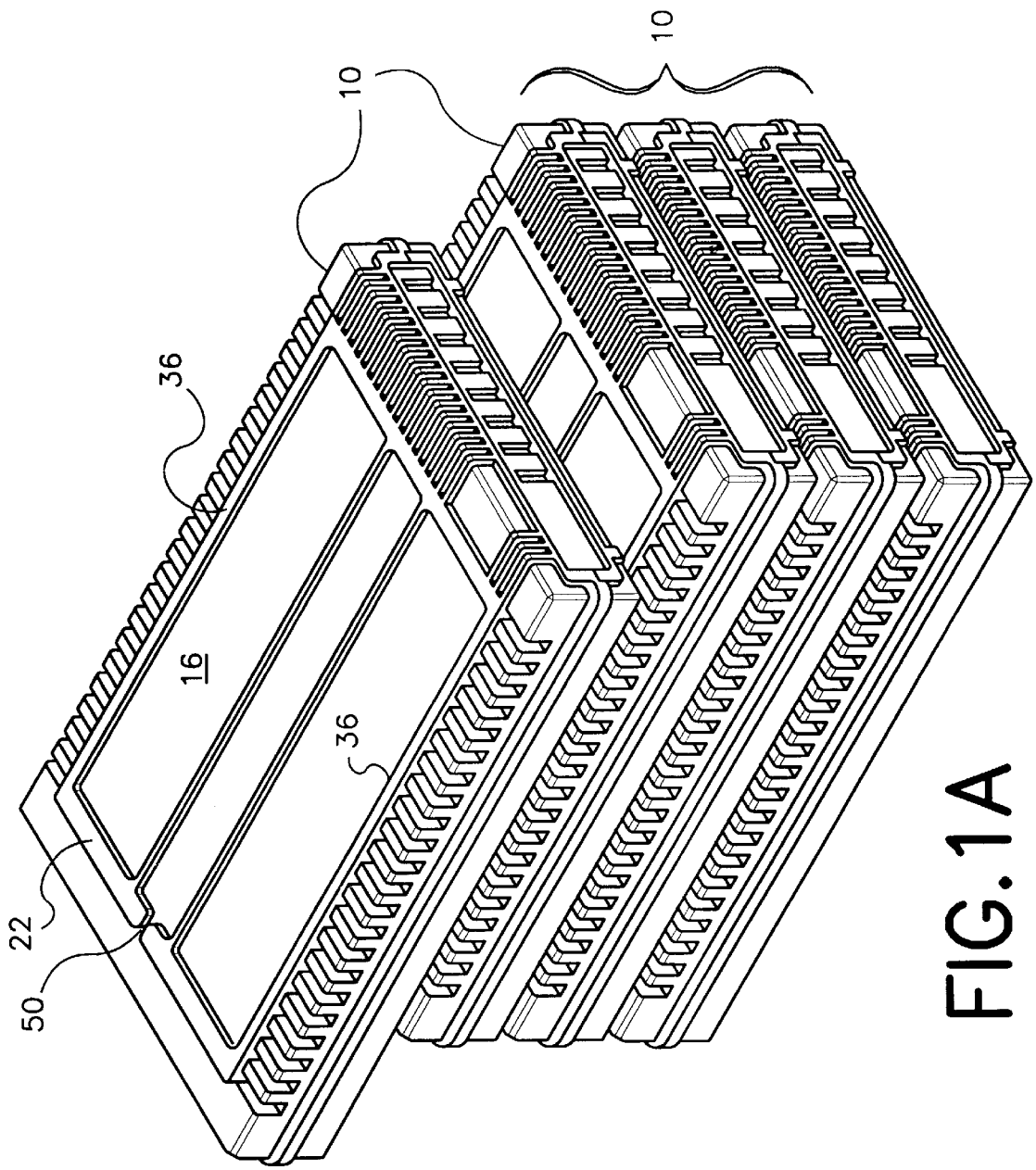
FIG. 1A is top perspective view of a cascaded modem apparatus, constructed in accordance with the teachings of the present invention, and illustrating adjacent modem apparatus in an intermediate configuration.

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

DETAILED DESCRIPTION OF THE PREFERRED EMBODIMENT

Figure 1B:
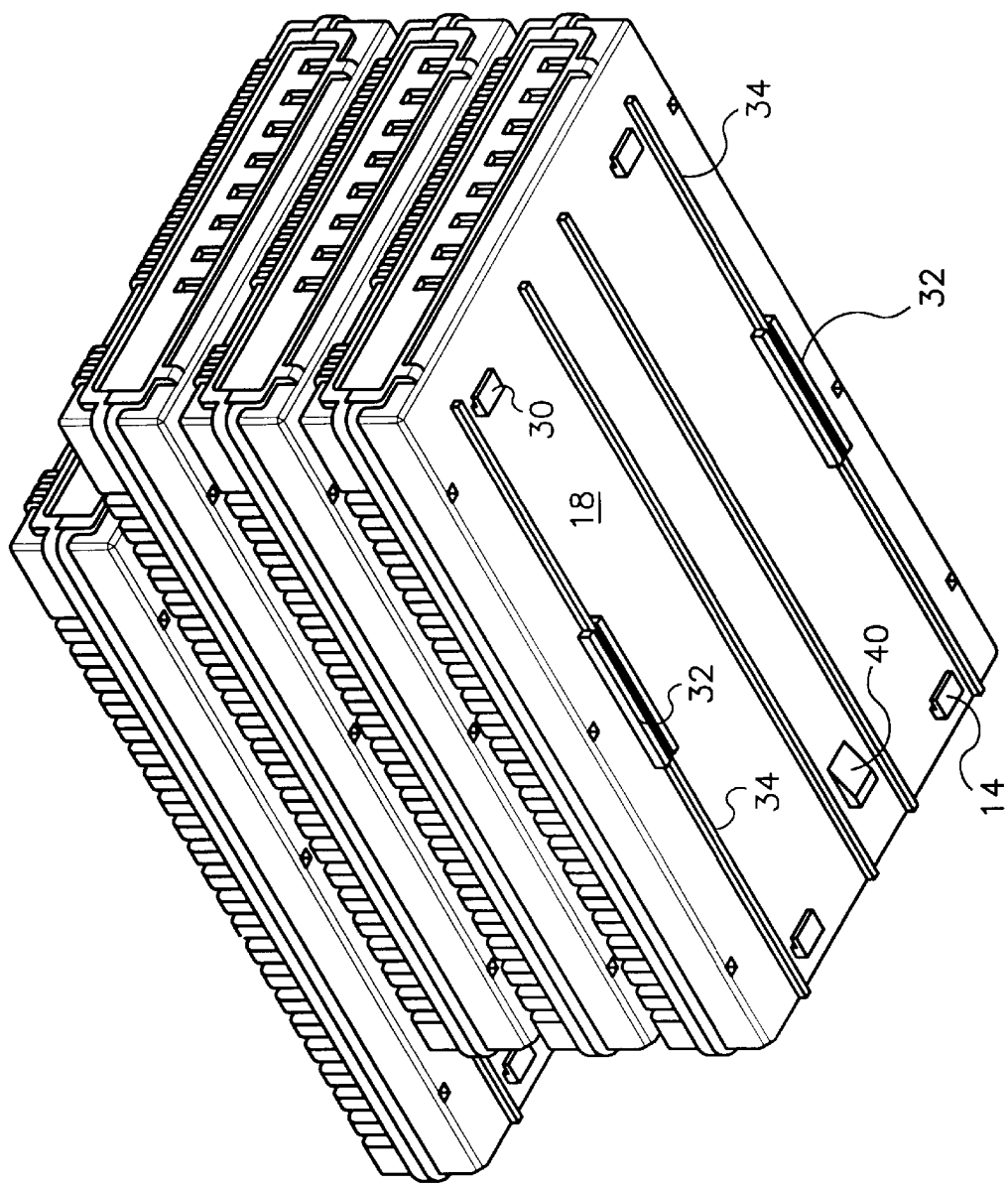
FIG. 1B is a bottom perspective view of the cascaded modem apparatus illustrated in FIG. 1A.

Turning now to the drawings, reference is made to FIGS. 1A and 1B, which illustrate upper and lower perspective views, respectively, of a plurality of modem assemblies interconnected in accordance with the teachings of the present inventions. Again, while the description is particularly directed to a modem configuration, the inventive concepts and teachings expressed herein are more broadly directed to DCE apparatus, including both modems and DSUs. More specifically, three modem assemblies 10 are illustrated as completely interconnected, while a fourth modem assembly 10 is illustrated adjacent the three connected modem assemblies 10 and offset therefrom. As previously summarized, an object of the present invention is to provide an efficient mechanism for securely interconnecting a plurality of external modem assemblies, of the type commonly cascaded in LAN systems, modem pools, etc.

In accordance with the preferred embodiment, the present invention is generally implemented by four angled feet 14, with one foot disposed near each corner of the bottom face 18 of the modem assemblies 10. Preferably, the angled feet 14 are integrally formed with the bottom face 18 of the modem housing. In an alternative embodiment, and consistent with the invention, more or less than four feet 14 may be provided. For example, the invention may be realized with two feet disposed in diagonally opposite corners of the bottom face 18 of the modem assembly 10.

To better illustrate the operation of the feet 14 in achieving the functionality of the present invention, reference is made to FIGS. 3A through 3F, which are cross-sectional side views of the cascaded modem assembly of FIGS. 1A and 1B, as taken substantially along line 3A—3A of FIG. 1B. Each modem assembly 10 is defined by a housing having a substantially planar top face 16 (see FIG. 1A) and substantially planar bottom face 18 (see FIG. 1B). The feet 14 are disposed to project away from the bottom face 18, then angle parallel and adjacent to the bottom face 18 (see FIG. 3C). In this regard, the feet 14 are integrally formed with the bottom face 18 of the modem assemblies 10 in cantilever fashion to define a distal, free-standing end 20. As will be described, the distal end 20 is disposed to be received into corresponding receiving slots 24 provided in the top of the modem housing, to secure adjacently disposed modems 10 in accordance with the invention.

As illustrated in FIG. 1 A, the top of the modem housing, while having a planar face 16, includes a raised rib portion 22. The top surface 16 (see FIG. 3C) defines a surface to abut the bottom face 18 of an adjacently disposed modem. As depicted in FIG. 1A, this raised rib structure extends substantially about the periphery of the top of the modem housing. Receiving slots 24 (See FIG. 3C) are provided in the vertical edges of the raised ribs 22 and corresponding in location to the angled feet 14 to receive the distal end 20 of the angled feet. In this way, the bottom surface of the feet 14 may rest upon the top surface of 16 of the modem housing to align (vertically) the distal end 20 of the feet 14 with the receiving slots 24.

To facilitate the alignment of the feet 14 with the receiving slots 24, guide rails 32 are provided on each side of the bottom of the modem housing (See FIG. 1B). Preferably, a pair of parallel runners 34 extend along the bottom of the modem housing near each side. These runners 34, preferably align with the sides 36 (FIG. 1A) of the raised ribs 22 on the top of the modem housing. Accordingly, the guides 32 are dimension to receive the sides 36 of the raised ribs 22. This insures proper lateral alignment of two adjacent modem assemblies as they are brought together. Once the modem assemblies are positioned as shown in FIGS. 1A and 1B, the top modem assembly 10 may be advanced forwardly with respect to the adjacent modem assembly 10 to glide the distal end 20 of the feet 14 into the receiving slots 24.

In accordance with the invention, the feet 14 may be angled in order to define an acute or pinched angle (not shown) between the distal end 20 and the bottom face 18 of the modem housing. In this configuration, and assuming the feet 14 are constructed of resilient material, as the feet 14 are slid into the receiving slots 24, the distal portion 20 is flexed to resiliently engage receiving slots 24. In this way, adjacent modem assemblies 10 may be securely attached in a press fit engagement. Thus, opposing force will disengage the attached modem assemblies 10.

Alternatively, a locking mechanism may be provided to securely engage two adjacent modem assemblies 10. In this regard, reference is made to FIGS. 2A through 2D, which illustrate a locking mechanism constructed in accordance with the preferred embodiment. Preferably, the locking mechanism comprises a resilient tab 40 that is integrally attached to the bottom 18 of the modem housing and projects downwardly therefrom toward the rear of the modem 10 (See FIG. 1B). As will be described in more detail below, the tab 40 flexes to permit attachment of two adjacent modem 10, and snaps into a latched position when the two adjacent modems 10 are aligned.

Figure 2A:
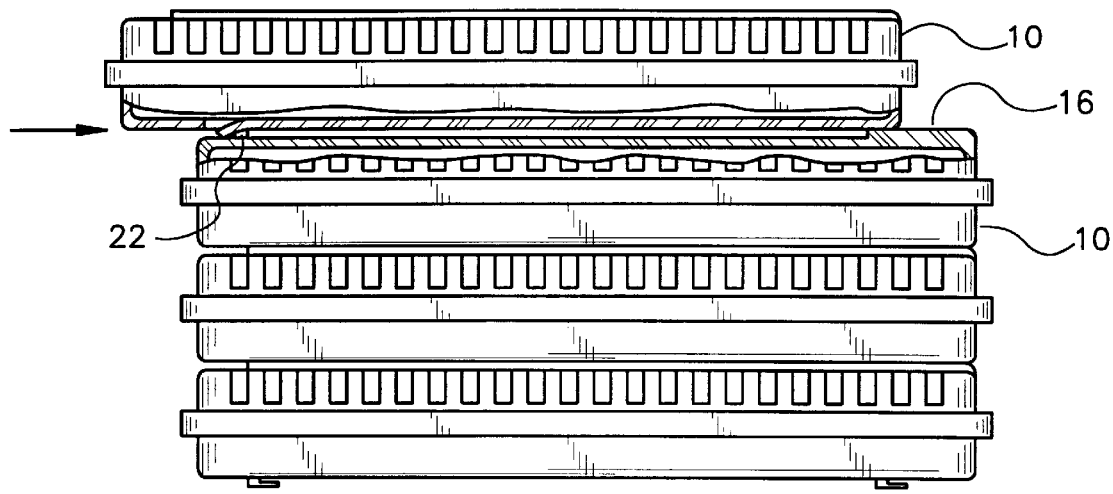
FIG. 2A is a cross-sectional side view of the modem apparatus of FIG. 1B as taken substantially along line 2A—2A.

To better illustrate this operation, reference is made to FIGS. 2A through 2D. As depicted in FIG. 2A, an upper modem assembly 10 is attached to an adjacent modem assembly 10 directly beneath it, by first bringing the bottom 18 of the upper modem assembly 10 into flush engagement with the top 16 of the lower modem assembly 16. As understood, due to the raised rib portions 22, the bottom 18 and top 16 will, in practice, be slightly spaced apart, and the tab 40 will generally project downwardly toward, if not engaging, the top 16 of the lower modem assembly 10.

Having established this initial placement of the modems, the upper modem 10 will be advanced forward, with respect to the lower modem 10. As depicted in FIG. 2C, the a nub 43 on the end of tab 40 will engage the raised rib 22, as the upper modem 10 is slid forward. A smooth curve that defines the nub 43 helps the nub 43, and thus the tab 40, to ride-up and pass over the raised rib 22. In this respect, the resilient tab 40 flexes to accommodate this motion.

Figure 2B:
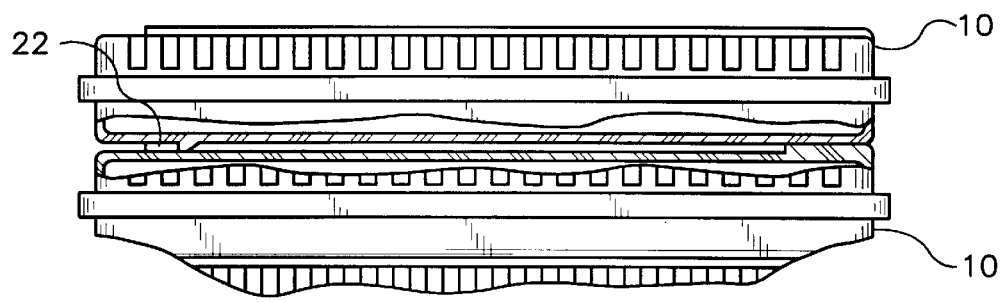
FIG. 2B is a cross-sectional side view similar to FIG. 2A, but illustrating the adjacent modem apparatus fully attached.
Figure 3A:
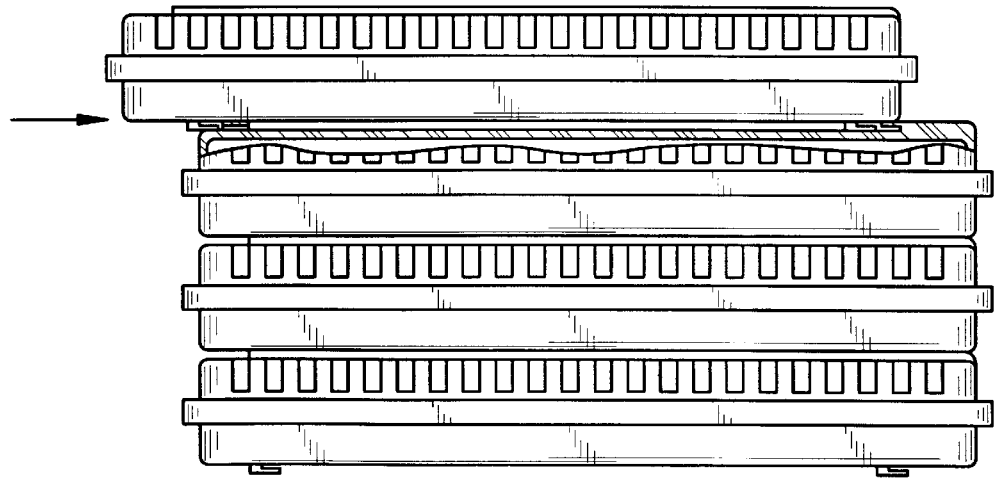
FIG. 3 is a cross-sectional side view of the modem apparatus of FIG. 1B as taken substantially along line 3A—3A.
FIG. 3B is a cross-sectional side view similar to FIG. 3A, but illustrating the adjacent modem apparatus fully attached.
FIGS. 3C and 3E are detailed views of portions of the modem apparatus of FIG. 3A.
FIGS. 3D and 3F are detailed views of portions of the modem apparatus of FIG. 3B.
Figure 3B:
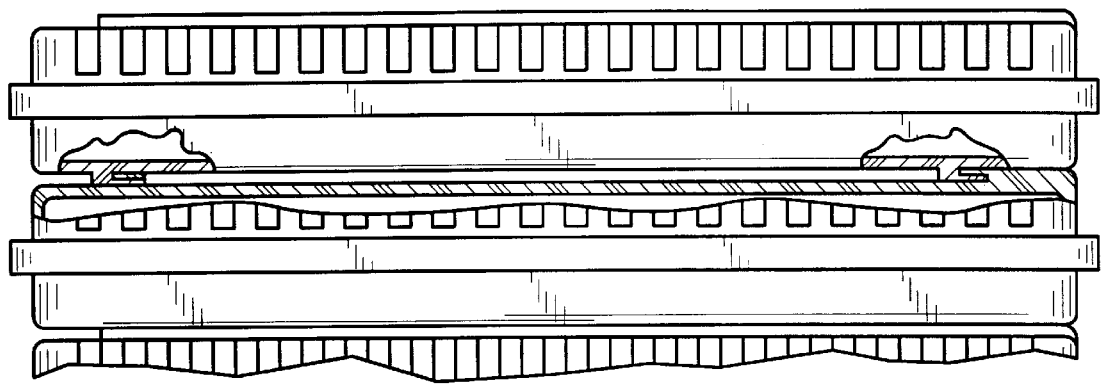
Figure 2C:
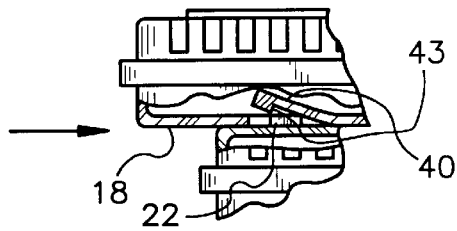
FIG. 2C is a detailed view of a portion of the modem apparatus of FIG. 2A.
Figure 2D:
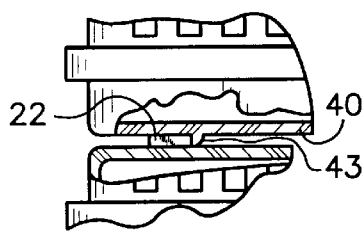
FIG. 2D is a detailed view of a portion of the modem apparatus of FIG. 2B.
Figure 3C:
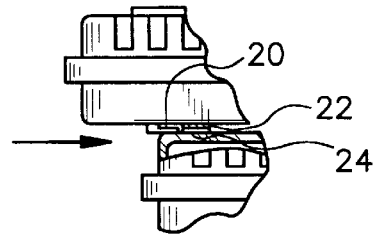
Figure 3D:
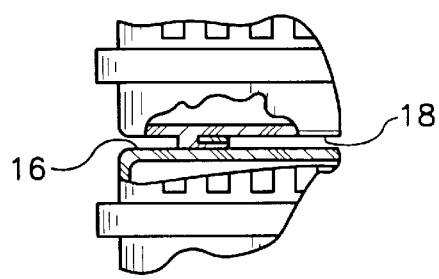
Figure 3E:
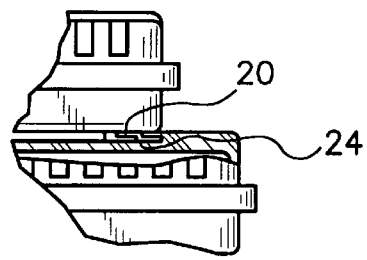
Figure 3F:
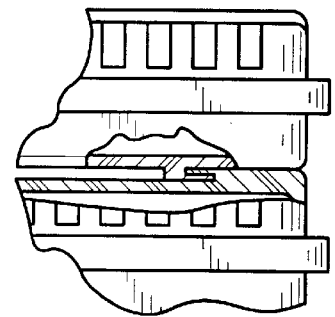

As illustrated in FIGS. 2B and 2D, once the modems 10 are vertically aligned, then the tab 40 has completely cleared the raised rib 22 and the tab 40 snaps into engagement with the top 16 of the lower modem 10, and abuts the raised rib 22. This abutment prevents the top modem 10 from being slid backwards and therefore detaching from the lower modem 10. In the manner previously described, once the two modems are slid into alignment, the free-standing end 20 of the feet 14 is received into receiving slots 24, which prevent vertical separation of the modems 10. In this way, the aligned modem assemblies 10 are steadfastly maintained in engagement.

Figure 4:
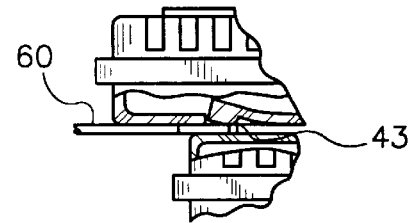
FIG. 4 is a partial cross-sectional view illustrating the use of a release tool to disengage the ing tab in order to detach two engaged, adjacent modems.

In order to detach the modem assemblies 10, a gap 50 is defined between the raised rib portions 22. Through this gap, a thin release tool 60 (FIG. 4), such as a small, plane-headed screw driver, may be inserted to engage and lift the end of the tab 40. Preferably, the release tool 60 will have a beveled end that facilitates this elevation of the tab 40. Once the tab 40 is elevated in this manner (e.g., sufficient to clear the raised rib 22), then the upper modem may be slid backward toward the position shown in FIG. 2A. Once the free-standing end 20 of feet 14 has completely retracted from the receiving slots 24, then the modem assemblies may be separated.

Figure 5:
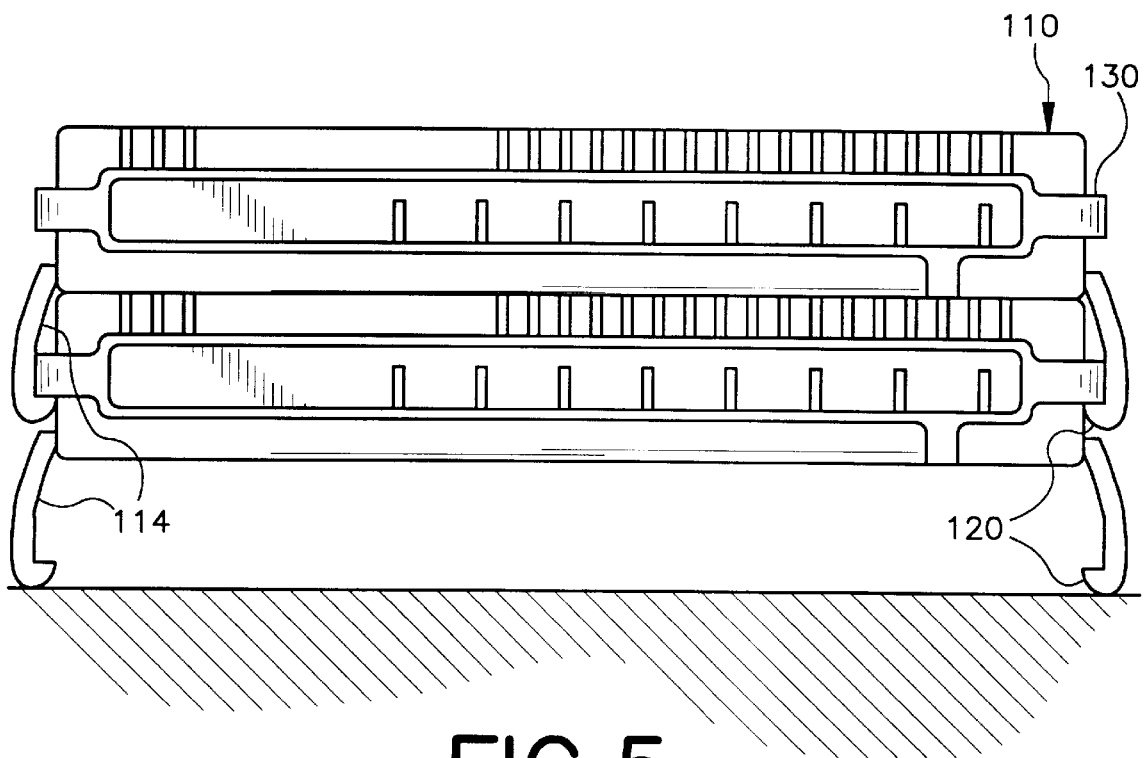
FIG. 5 is a front view of a cascaded modem apparatus, constructed in accordance with an alternative embodiment of the present invention.

It will be appreciated by those possessing ordinary skill in the art that the present invention is not limited to the particular form embodied in previously described figures. Indeed, FIG. 5 illustrates one of a number of other physical embodiments that may be implemented consistent with the concepts and teachings of the present invention. As shown in FIG. 5, which presents a front view, modem feet 114 may be again utilized to serve both as a platform for supporting adjacent modems 110, as well as for securely attaching adjacent modems 110. Briefly, the embodiment of FIG. 5 depicts two attached, adjacent modems 110, having a plurality of downwardly disposed feet 114, which are attached to the modem 110 at the sides 115 thereof The modems 110 each have a housing that defines a seam 130 that projects slightly out from the sides 115. The free-standing ends 120 of feet 114 define inwardly-directed hook portions that captively engage the seam 130 of an adjacent modem 110. To facilitate the attachment of adjacent modems 110, the bottom side of the free-standing ends 120 of the feet 114 is rounded.

Two modems 110 are attached by aligning the modems 110 vertically, then, while maintaining the alignment, bringing the modems 110 together. While the bottom side of the free-standing ends 120 of the feet 114 will engage the top side of the seam 130, applying pressure to further bring the modems 110 together causes the feet to flex outwardly (due to the rounded bottom) and pass over the seam 130. Once passed the seam 130, the free-standing end 120 of the feet 114 snap inwardly to engage the seam 130, and steadfastly hold the modems together.

The modems 110 may, thereafter, be separated by manually flexing the feet 114, on one side of the top modem 110, outwardly to release their engagement of the seam 130.

Alternatively, the modems 110 may be slid in opposing forward/rearward directions, allowing the gripping feet 114 to slide along the seam 130, until slid clear therefrom.

Again, the foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A cascadable data communication equipment (DCE) apparatus comprising:

a housing having a top and a bottom;

a plurality of angled feet attached to the housing bottom in cantilever fashion to define a distal portion of each foot;

a plurality of receiving slots defined in the housing top and disposed to receive the distal portions of a plurality of angled feet from an adjacent housing;

a resilient locking tab attached to the housing bottom in cantilever fashion to define a distal portion directed away from the housing bottom, the tab being responsive to force applied to the distal portion to flex inwardly toward the housing bottom;

a raised portion on the housing top configured to engage a locking tab from an adjacent housing and interlock the two adjacent housings.

2. The cascadable apparatus as defined in claim 1, wherein the raised portion is configured to operatively engage and flex the locking tab as the two adjacent housings are slid relatively to each other while juxtaposed.

3. The cascadable apparatus as defined in claim 1, wherein the receiving slots are configured to releasably engage the distal portions of the angled feet as the feet are slid into the receiving slots while the housing are juxtaposed.

4. The cascadable apparatus as defined in claim 1 further including at least one guide for facilitating sliding engagement between the two adjacent housings.

5. The cascadable apparatus as defined in claim 4, wherein the at least one guide includes cooperatively disposed portions on the housing top and housing bottom.

6. The cascadable apparatus as defined in claim 5, wherein the portions include a channel portion disposed on the housing bottom and a raised rib portion disposed on the housing top, wherein the raised rib portion is slidably engaged by a channel portion of an adjacently disposed housing.

7. The cascadable apparatus as defined in claim 6, further including two channel portions on the housing bottom and two correspondingly disposed raised rib portions disposed on the housing top.

8. The cascadable apparatus as defined in claim 1, wherein the DCE apparatus includes at least one apparatus from the group consisting of:

a modem;

a digital service unit.

9. A cascadable data communication equipment (DCE) apparatus comprising:

a housing having a top and a bottom;

a plurality of feet attached to the housing bottom, each foot defining a freestanding distal portion;

feet engaging means disposed in the housing top for releasably engaging the distal portion of the plurality of feet of an adjacent housing; and locking means associated with the housing for releasably interlocking two aligned and adjacently disposed housings.

10. The cascadable apparatus as defined in claim 9, wherein the feet engaging means includes a plurality of receiving slots defined in the housing top.

11. The cascadable apparatus as defined in claim 9, wherein the locking means includes a resilient locking tab attached to the housing bottom in cantilever fashion to define a distal portion directed away from the housing bottom, the tab being responsive to force applied to the distal portion to flex inwardly toward the housing bottom.

12. The cascadable apparatus as defined in claim 11, wherein the locking means further includes a raised portion on the housing top configured to engage a locking tab from an adjacent housing and to form an interference fit when the adjacent housings are brought into aligned, adjacent engagement.

13. The cascadable apparatus according to claim 9, wherein the locking means includes a press-fit engagement formed between the feet and feet engaging means.

14. The cascadable apparatus according to claim 9, wherein the distal portion of the plurality of feet are offset from the housing bottom.

15. The cascadable apparatus according to claim 14, wherein the feet engaging means includes a plurality of receiving slots defined in the housing top.

16. The cascadable apparatus according to claim 15, wherein the receiving slots align with the offset distal portions.

17. The cascadable apparatus according to claim 9, further including at least one guide for facilitating sliding engagement between the two adjacent housings.

18. The cascadable apparatus as defined in claim 17, wherein the at least one guide includes cooperatively disposed portions on the housing top and housing bottom.

19. The cascadable apparatus as defined in claim 18, wherein the portions include a channel portion disposed on the housing bottom and a raised rib portion disposed on the housing top, wherein the raised rib portion is slidably engaged by a channel portion of an adjacently disposed housing.

20. The cascadable apparatus as defined in claim 6, further including two channel portions on the housing bottom and two correspondingly disposed raised rib portions disposed on the housing top.

21. A cascadable apparatus comprising:

a housing having a top and a bottom;

a plurality of angled feet attached to the housing in cantilever fashion to define a distal portion of each foot, wherein the distal portion projects below the housing bottom; and means attached to the housing for releasably engaging the distal portion of the feet;

whereby two adjacent housings are releasably held in fixed relation.

22. The cascadable apparatus as defined in claim 21, wherein the feet are attached to the housing bottom.

23. The cascadable apparatus as defined in claim 21, wherein the feet are attached attached to sides of the housing.

24. The cascadable apparatus as defined in claim 21, wherein the DCE apparatus include at least one apparatus selected from the group consisting of:

a modem; and a digital service unit.

* * * * *

UNITED STATES PATENT AND TRADEMARK OFFICE
CERTIFICATE OF CORRECTION

PATENT NO. : 5,864,467
DATED : January 26, 1999
INVENTOR(S) : Giovanni Recchia; Thomas Georgopulos It is certified that error appears in the above-identified patent and that said Letters Patent is hereby corrected as shown below:

Column 1, line 56, delete "modem" and replace with --modems--.

Column 1, line 58, after "upon" insert --the--.

Column 2, line 10, delete "external modems" and replace with --DCE devices--.

Column 2, line 57, delete "simple" and replace with --simply--.

Column 3, line 6, after "is" insert --a--.

Column 5, line 14, delete "assembly 16" and replace with --assembly 10--.

Column 5, line 21, after "FIG. 2C," delete --the--.

Column 5, line 64, after "thereof" insert --.--.

Column 6, line 14, after "modems" insert --110--.

Column 6, line 61, delete "housing" and replace with --housings--.

Column 8, line 39, after "attached" delete --attached--.

UNITED STATES PATENT AND TRADEMARK OFFICE
CERTIFICATE OF CORRECTION

PATENT NO. : 5,864,467
DATED : January 26, 1999
INVENTOR(S) : Giovanni Recchia; Thomas Georgopulos It is certified that error appears in the above-identified patent and that said Letters Patent is hereby corrected as shown below:

Column 8, line 42, delete "include" and replace with --includes--.

Signed and Sealed this

Twenty-eighth Day of December, 1999

Attest:

Q. TODD DICKINSON

*Attesting Officer*     *Acting Commissioner of Patents and Trademarks*